United States Patent
Kohan

(10) Patent No.: US 6,590,153 B1
(45) Date of Patent: Jul. 8, 2003

(54) ELECTRONIC CIRCUIT CARDS

(75) Inventor: Kamran Kohan, Orange, CA (US)

(73) Assignee: ADC DSL Systems, Inc., Eden Prairie, MN (US)

(*) Notice: Subject to any disclaimer, the term of this patent is extended or adjusted under 35 U.S.C. 154(b) by 0 days.

(21) Appl. No.: 10/105,894

(22) Filed: Mar. 25, 2002

(51) Int. Cl.[7] .............................................. H05K 9/00
(52) U.S. Cl. .......................... 174/35 C; 174/35 GC; 211/41.17; 361/797; 361/800; 361/801; 361/785; 361/789
(58) Field of Search ..................... 174/35 GC, 35 R, 174/35 C; 361/816, 818, 800, 785, 789, 797, 799, 801; 211/41.17

(56) References Cited

U.S. PATENT DOCUMENTS

| | | | |
|---|---|---|---|
| 4,631,641 A | * 12/1986 | Brombal et al. ............ 361/818 |
| 5,084,802 A | 1/1992 | Nguyenngoc | |
| 5,746,326 A | * 5/1998 | Hong ...................... 211/41.17 |
| 5,885,118 A | * 3/1999 | Billenstein et al. ......... 439/862 |
| 6,395,976 B1 | * 5/2002 | Koradia et al. ........ 174/35 GC |
| 6,483,023 B1 | * 11/2002 | Jacques ................ 174/35 GC |
| 2002/0012237 A1 | * 1/2002 | Dimarco .................... 361/796 |

OTHER PUBLICATIONS

"Slot Mount Series, Trip Metal Gaskets and Grounding Products", product brochure, Instrument Specialties (3 pages).
"AR Style Holdown""BR Style Holdown", Jan. 28, 2002, The Siemon Company product brochure (3 pages).
AMP Incorporated, Harrisburg, PA, 1986, application specification (5 pages) CHAMP Latch.

* cited by examiner

*Primary Examiner*—Hung V. Ngo
(74) *Attorney, Agent, or Firm*—Fogg and Associates, LLC; Laura A. Ryan; Tod A. Myrum

(57) ABSTRACT

An electronic circuit card includes a circuit board and a faceplate attached to the circuit board. A connector is mounted on the faceplate such that the electronic circuit card occupies substantially one slot of a housing when the electronic circuit card is contained in the housing. The connector is also mounted on the faceplate to enable contact between the faceplate and a faceplate of an adjacent electronic circuit card for shielding against electromagnetic interference leakage when the electronic circuit card is contained in the housing. A ribbon cable electrically interconnects the connector and the circuit board. A strap is attached to the faceplate. The strap is adapted to secure a mating connector to the connector.

59 Claims, 8 Drawing Sheets

ELECTRONIC CIRCUIT CARDS

TECHNICAL FIELD

The present invention relates generally to the field of electronics and, in particular, to electronic circuit cards.

BACKGROUND

Electronic circuit cards are frequently deployed in housings at central offices, remote units, such as digital loop carriers, or the like of telecommunication systems. Many electronic circuit cards include a faceplate that is attached to a circuit board of the electronic circuit card. The faceplate typically serves to identify functions of any ports, LEDs, switches, or displays of the circuit board. In addition, many faceplates protect against electromagnetic interference (EMI).

Usually a number of electronic circuit cards are inserted into slots within a housing so that each of the circuit cards occupies substantially each of the slots. Typically, the electronic circuit cards are connected to a backplane within the housing. Electronic circuit cards often emit EMI that can adversely affect the performance of other electronics, such as electronics of a central office. Consequently, to shield against radiation of EMI (or EMI leakage) from the housing, adjacent sides of faceplates of electronic circuit cards located in adjacent slots make contact (hereinafter to be referred to as panel-to-panel contact), e.g., via EMI gaskets deployed on one or more of the adjacent sides.

Some of these electronic circuit cards connect to customer premises equipment for providing digital subscriber loop (DSL) services, e.g., high-bit-rate DSL (HDSL), asymmetric DSL (ADSL), very high-bit-rate DSL (VDSL) and others, and respectively transmit and receive voice and data signals to and from the customer premises equipment. Connection between the customer premises equipment is usually accomplished through the backplane. However, in some instances, there are insufficient ports on the backplane for connecting the electronic circuit cards to the customer premises equipment. For example, in some applications, electronic circuit cards of adjacent slots are interconnected at the backplane by a cable so that nearly all of the ports at the backplane are in use.

One way of adding ports to the electronic circuit card is by locating a connector, such as a 50-pin telco connector, opposite the backplane at the front of the electronic circuit card. One method of connecting the connector to the electronic circuit card involves mounting the connector directly on the circuit board of electronic circuit card. However, when the connector is mounted on the circuit board it extends beyond a side of the faceplate. Consequently, a cutout is made in the faceplate that extends through the side of the faceplate to accommodate the connector. One problem with this is the cutout makes it difficult to seal the housing against EMI leakage because the cutout creates a gap between the faceplate and a faceplate of an adjacent electronic circuit card through which the EMI can leak.

Another problem is the connector extends into an adjacent slot of the housing so that the electronic circuit card occupies more than one slot of the housing. This reduces the number of cards that can fit into the housing and increases costs when renting space in a central office, for example. This also makes it difficult to remove or insert a circuit card in the adjacent slot, e.g., during maintenance or repair procedures or the like, because the connector extends into the adjacent slot.

In addition, when a mating connector is connected to the connector, it is difficult to secure the mating connector to the connector. Consequently, the mating connector can be disconnected from the connector, for example by a technician brushing against cabling attached to the mating connector.

For the reasons stated above, and for other reasons stated below that will become apparent to those skilled in the art upon reading and understanding the present specification, there is a need in the art for alternatives for adding ports to electronic circuit cards.

SUMMARY

The above-mentioned problems with adding ports to electronic circuit cards and other problems are addressed by embodiments of the present invention and will be understood by reading and studying the following specification.

In one embodiment, an electronic circuit card is provided. The electronic circuit card includes a circuit board and a faceplate attached to the circuit board. A connector is mounted on the faceplate such that the electronic circuit card occupies substantially one slot of a housing when the electronic circuit card is contained in the housing. The connector is also mounted on the faceplate to enable contact between the faceplate and a faceplate of an adjacent electronic circuit card for shielding against electromagnetic interference leakage when the electronic circuit card is contained in the housing. A ribbon cable electrically interconnects the connector and the circuit board. A strap is attached to the faceplate. The strap is adapted to secure a mating connector to the connector.

Further embodiments of the invention include methods and apparatus of varying scope.

DETAILED DESCRIPTION

In the following detailed description, reference is made to the accompanying drawings that form a part hereof, and in which is shown by way of illustration specific illustrative embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense.

Embodiments of the present invention provide for adding ports to an electronic circuit card by mounting a connector on a faceplate of the electronic circuit card and connecting the connector to a circuit board of the electronic circuit card using a ribbon cable so that the connector does not extend beyond a side of the faceplate, as is the case when the connector is mounted on the circuit board. This enables the electronic circuit card to occupy substantially one slot of a housing, thereby enabling more cards to fit into the housing and easing removal and insertion of an adjacent circuit card compared to when the connector extends beyond the side of the faceplate and into an adjacent slot. This also enables contact between the faceplate and a faceplate of the adjacent electronic circuit card for shielding against electromagnetic interference leakage that is not otherwise provided when a cutout is made in the faceplate to accommodate the connector when the connector is mounted on the circuit board. Embodiments of the present invention provide a strap that is attached to the faceplate. The strap is adapted to secure a mating connector to the connector, thereby reducing the risk of the mating connector becoming disconnected from the connector, for example when a technician brushes against cabling attached to the mating connector.

Figure 1:
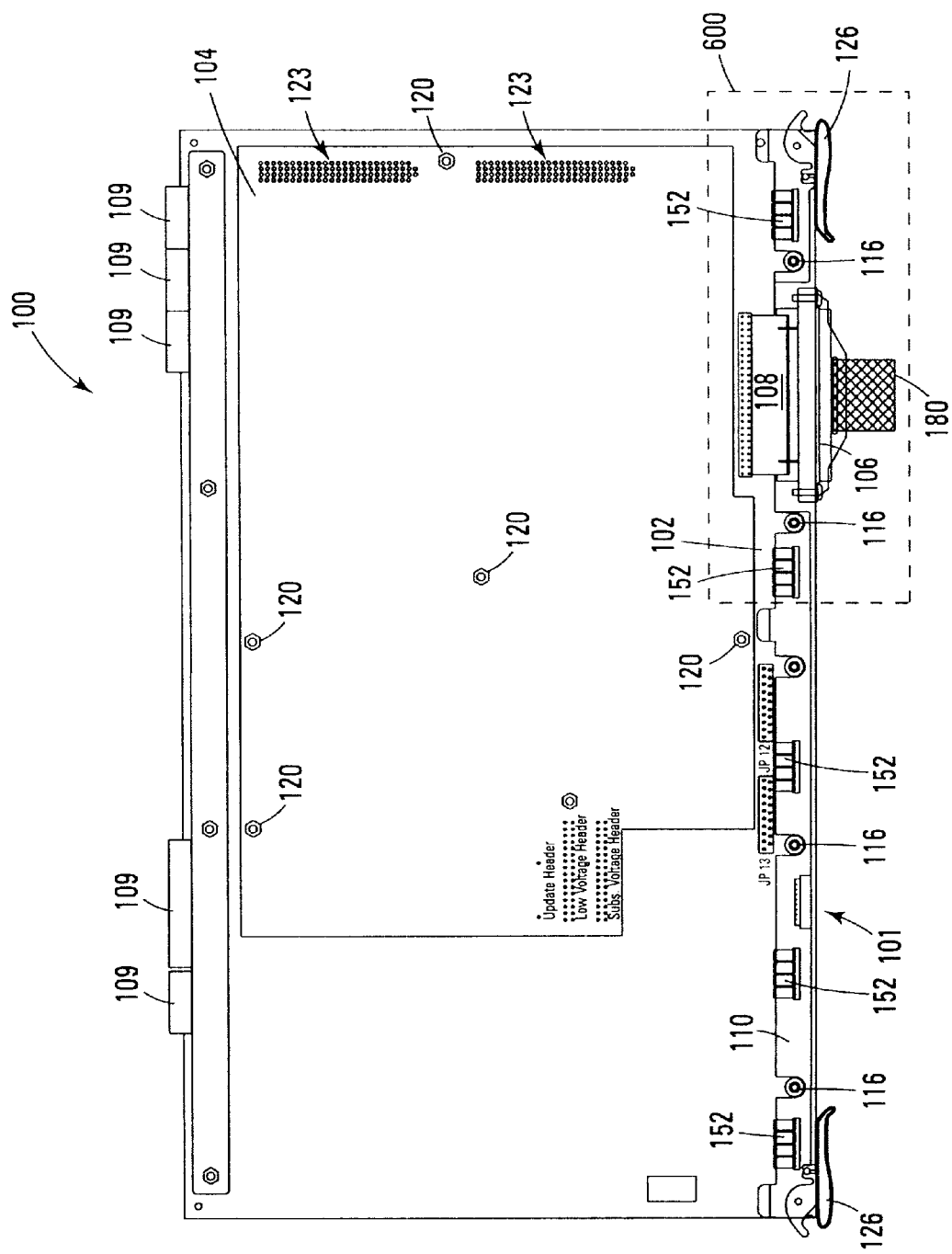
FIG. 1 is a top view of an electronic circuit card according to an embodiment of the present invention.
Figure 2:
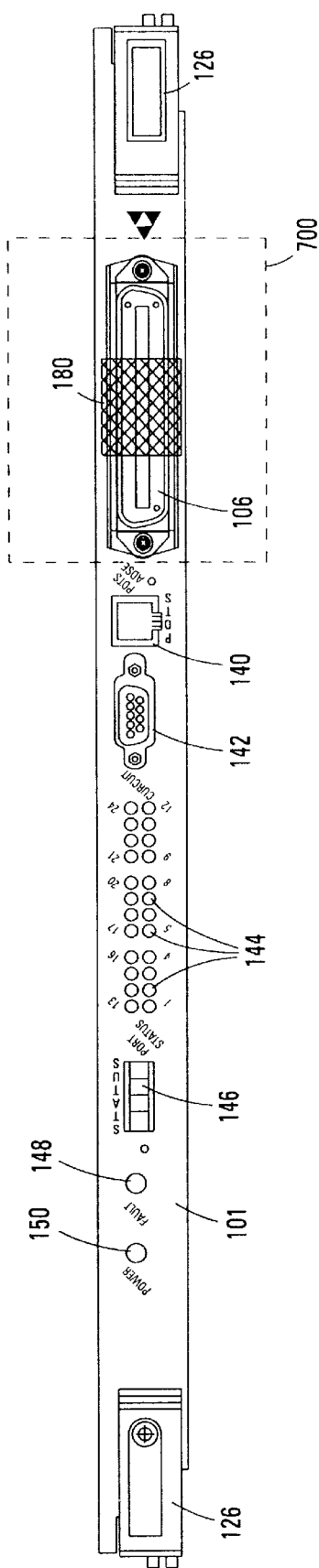
FIG. 2 is a front view of the electronic circuit card of FIG. 1.
Figure 3:
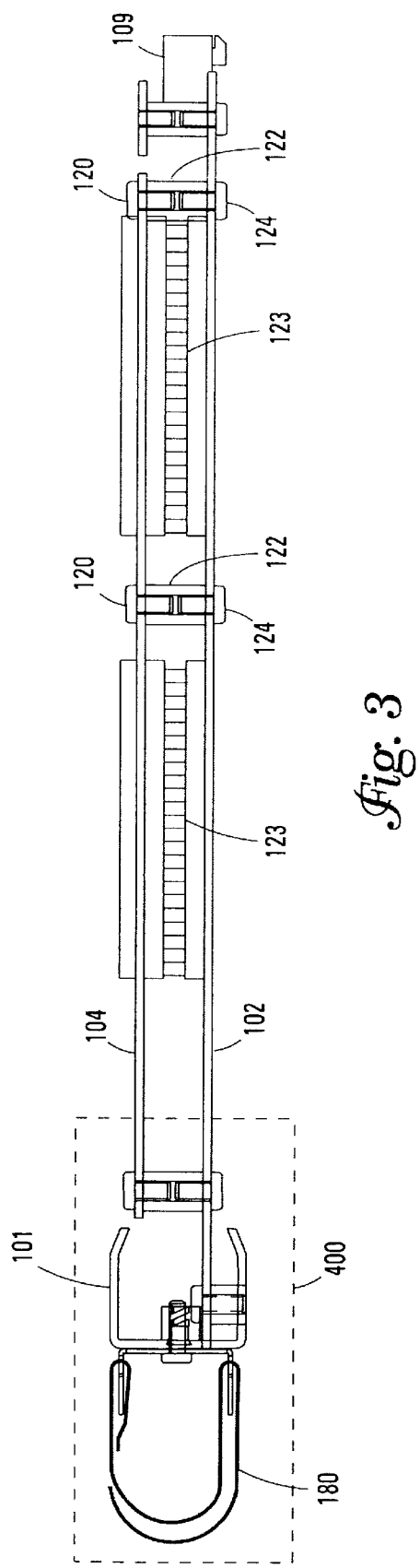
FIG. 3 is a side view of the electronic circuit card of FIG. 1.

FIGS. 1, 2, and 3 are respectively top, front, and right side views of an electronic circuit card 100 according to an embodiment of the present invention. In one embodiment, electronic circuit card 100 is disposed in a housing located at a central office, a remote unit, e.g., a digital loop carrier, or the like. In other embodiments, electronic circuit card 100 is connectable to customer premises equipment for providing DSL services, e.g., HDSL, ADSL, VDSL, and others.

Electronic circuit card 100 includes a faceplate 101. A circuit board 102 of electronic circuit card 100 is attached to faceplate 101, and in one embodiment, a circuit board 104 is mounted on circuit board 102. A connector 106 is mounted on faceplate 101. In various embodiments, connector 106 adds ports to electronic circuit card 100 for conveying voice and data signals to and from circuit board 102. In some embodiments, connector 106 is a 50-pin telco connector available from Amp, a TYCO International Ltd. Company, Inc., Stoney Creek, Alberta, Canada, as part number 553602-1, e.g., for adding 25 paired ports. In other embodiments, connector 106 provides POTS/DSL ports for electronic circuit card 100. A cable 108, such as a ribbon cable, interconnects connector 106 and circuit board 102.

Figure 8:
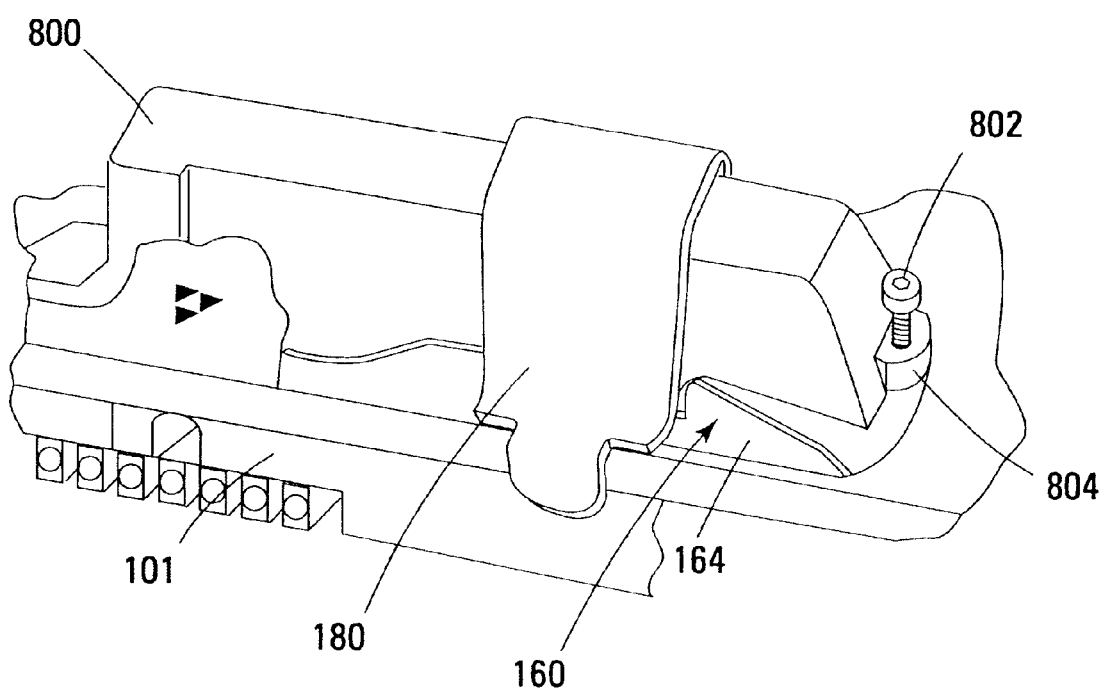
FIG. 8 is a perspective view illustrating a mating connector secured to a connector of the electronic circuit card of FIG. 1 according to an embodiment of the present invention.

In one embodiment, connector 106 is connectable to a mating connector 800 (shown in FIG. 8). In another embodiment, mating connector 800 is electrically connected to customer premises equipment and conveys voice and data signals between the customer premises equipment and electronic circuit card 100 via connector 106. In some embodiments, a strap 180 is attached to faceplate 101. The strap is wrappable about mating connector 800, as shown in FIG. 8, for securing mating connector 800 to connector 106. In another embodiment, electronic circuit card 100 is electrically connectable to a backplane in a housing via connectors 109 that are disposed on circuit board 102 and electrically connected to circuit board 102. In other embodiments, latches 126 are pivotally attached to faceplate 101 for securing electronic circuit card 100 within the housing by latching faceplate 101 to the housing.

Figure 4:
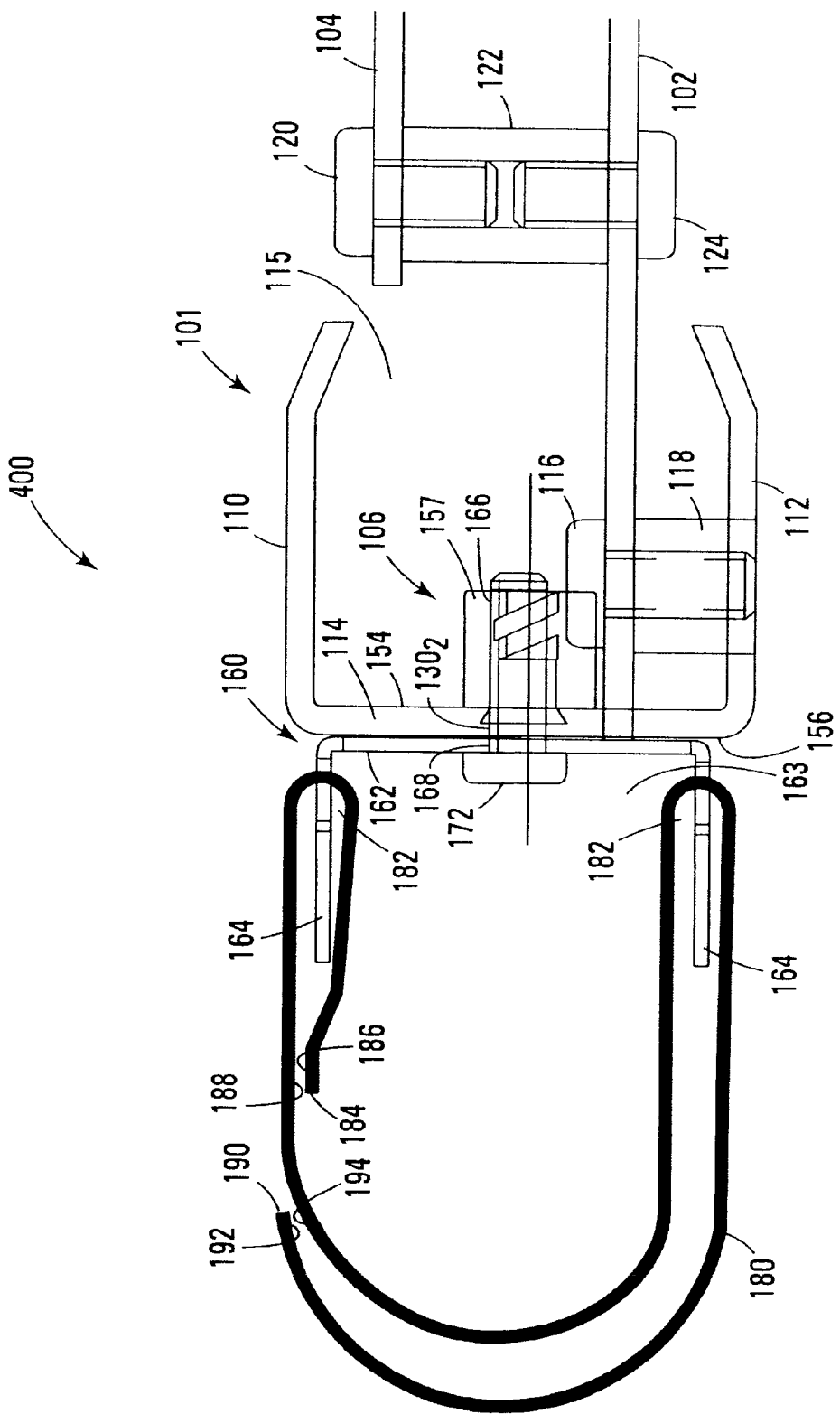
FIG. 4 is an enlarged view of region 400 of FIG. 3.

More specifically, as shown in FIG. 4, an enlarged view of region 400 of FIG. 3, faceplate 101 includes sides 110 and 112 and a front 114 attached between sides 110 and 112 to form a channel 115 in faceplate 101 that is substantially U-shaped. In one embodiment, sides 110 and 112 and front 114 are integral. Circuit board 102 extends into channel 115 between sides 110 and 112 and is attached to side 112 using fasteners 116, such as hex-, Philips- Allen-, slot-head screws, or the like. Each of fasteners 116 passes through circuit board 102 and through a spacer 118 that spaces circuit board 102 from side 112. Each of fasteners 116 then threads into side 112. As shown in FIGS. 3 and 4, circuit board 104 is mounted on circuit board 102 by spacing circuit boards 102 and 104 apart using spacers 122, passing screws 120 through circuit board 104, threading screws 120 into spacers 122, passing screws 124 through circuit board 102, and threading screws 124 into spacers 122. In one embodiment, connectors 123 electrically interconnect circuit boards 102 and 104. In another embodiment, circuit boards 102 and 104 are respectively a motherboard and a daughter board. In some embodiments, each of circuit boards 102 and 104 include electronic components, such as power supplies, logic devices, relays, splitters, or the like.

Figure 5:
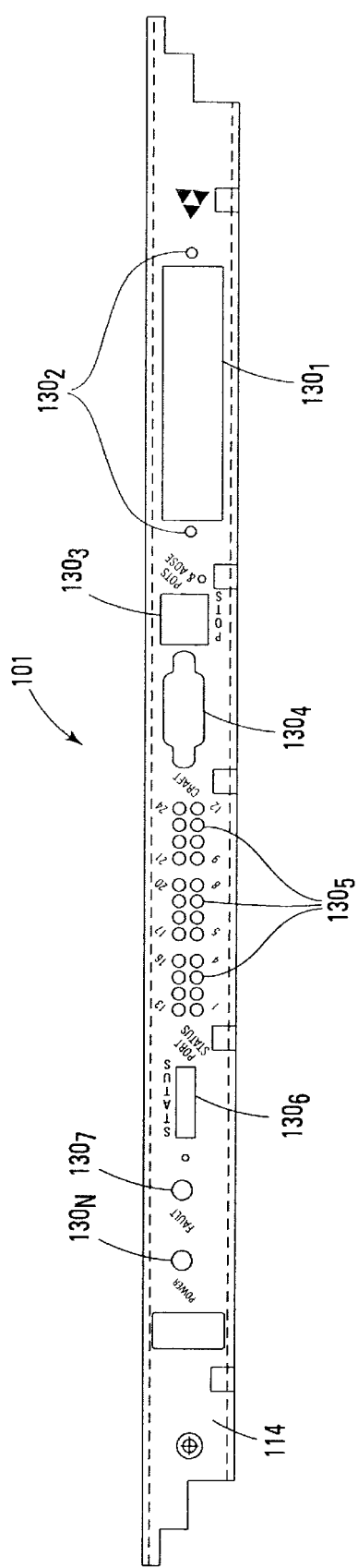
FIG. 5 is a front view illustrating apertures in a faceplate of the electronic circuit card of FIG. 1 according to an embodiment of the present invention.

FIG. 5 is a front view illustrating apertures (or cutouts) $130_1$ to $130_N$ in front 114 of faceplate 101. Aperture $130_1$ provides access to connector 106. In various embodiments, aperture $130_3$ provides access to a connector 140 of electronic circuit card 100, as shown in FIG. 2, that acts as a port for POTS signals, e.g., an RJ-11 connector available from Amp, a TYCO International Ltd. Company, Inc., Stoney Creek, Alberta, Canada. In other embodiments, aperture $130_4$ provides access to a craft port 142 of electronic circuit card 100, e.g., an RS-232 port, as shown in FIG. 2. In one embodiment, a personal computer, an emulation terminal, or the like, is connected to craft port 142 to monitor and/or alter the operation of electronic circuit card 100. In some embodiments, apertures $130_5$, aperture $130_6$, aperture $130_7$, and aperture $130_N$ respectively provide access to LEDs 144, LED display 146, LED 148, and LED 150 of electronic circuit card 100, each for indicating status of electronic circuit card 100.

Figure 6:
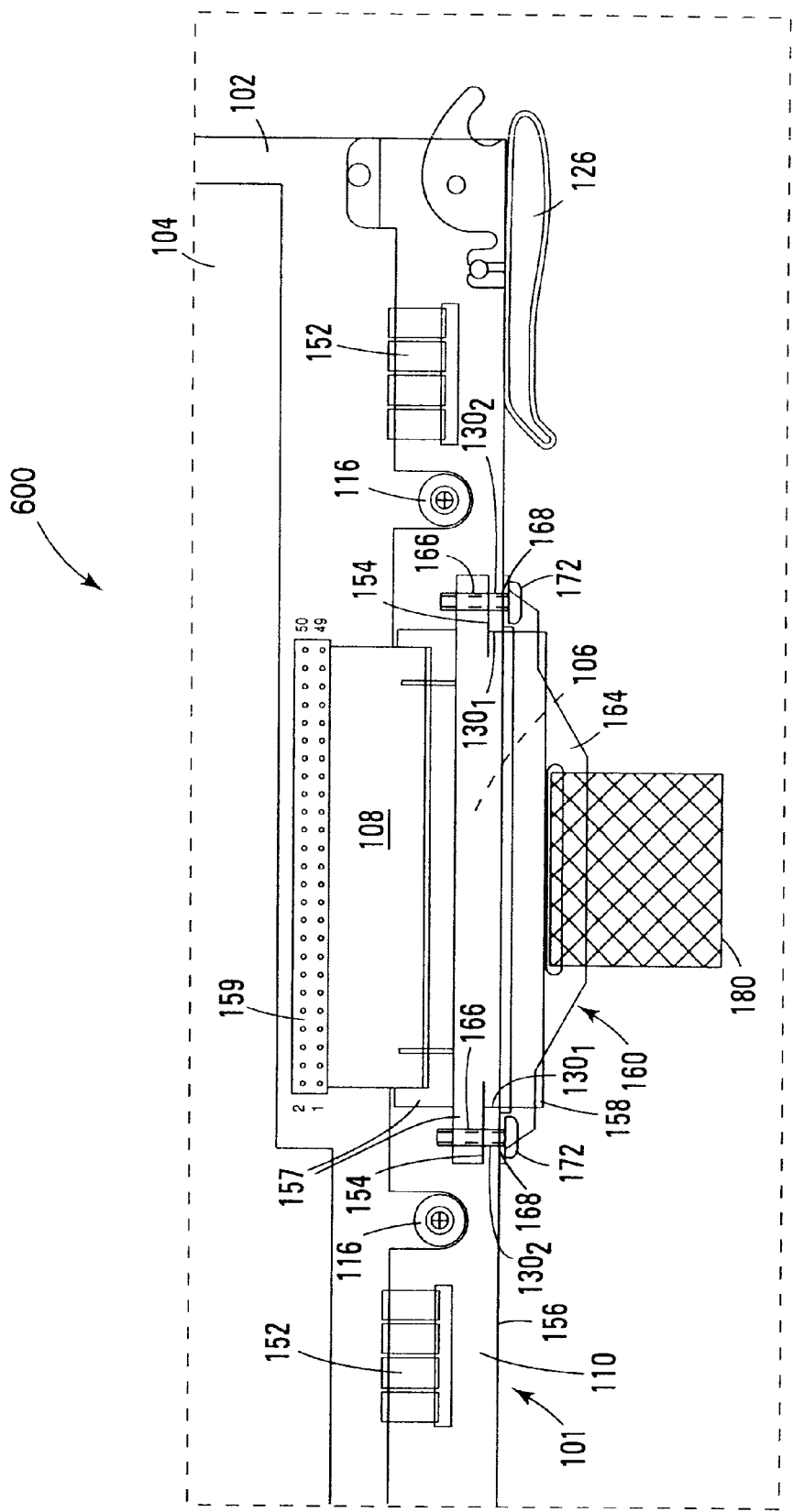
FIG. 6 is an enlarged view of region 600 of FIG. 1.

In various embodiments, a number of electromagnetic interference gaskets 152, e.g., available from ADC Telecommunications, Inc., Eden Prairie, Minn. as part number 673-1083-01, are disposed on side 110 of faceplate 101, as shown in FIG. 1 and FIG. 6 an enlarged view of region 600 of FIG. 1. In one embodiment, each of electromagnetic interference gaskets 152 protrudes from side 110 and are secured to side 110 by snapping, riveting, or the like. In another embodiment, side 110 includes an integral electromagnetic interference gasket. In other embodiments, each of interference gaskets 152 is a formulation of copper and beryllium or the like. In one embodiment, electromagnetic interference gaskets 152 engage a side of a faceplate of an adjacent electronic circuit card when electronic circuit card 100 is inserted in a housing to form panel-to-panel contact between side 110 and the side of the adjacent faceplate. This forms an electromagnetic interference shield between faceplate 101 and the adjacent faceplate that shields against electromagnetic interference leakage between the faceplates.

Figure 7:
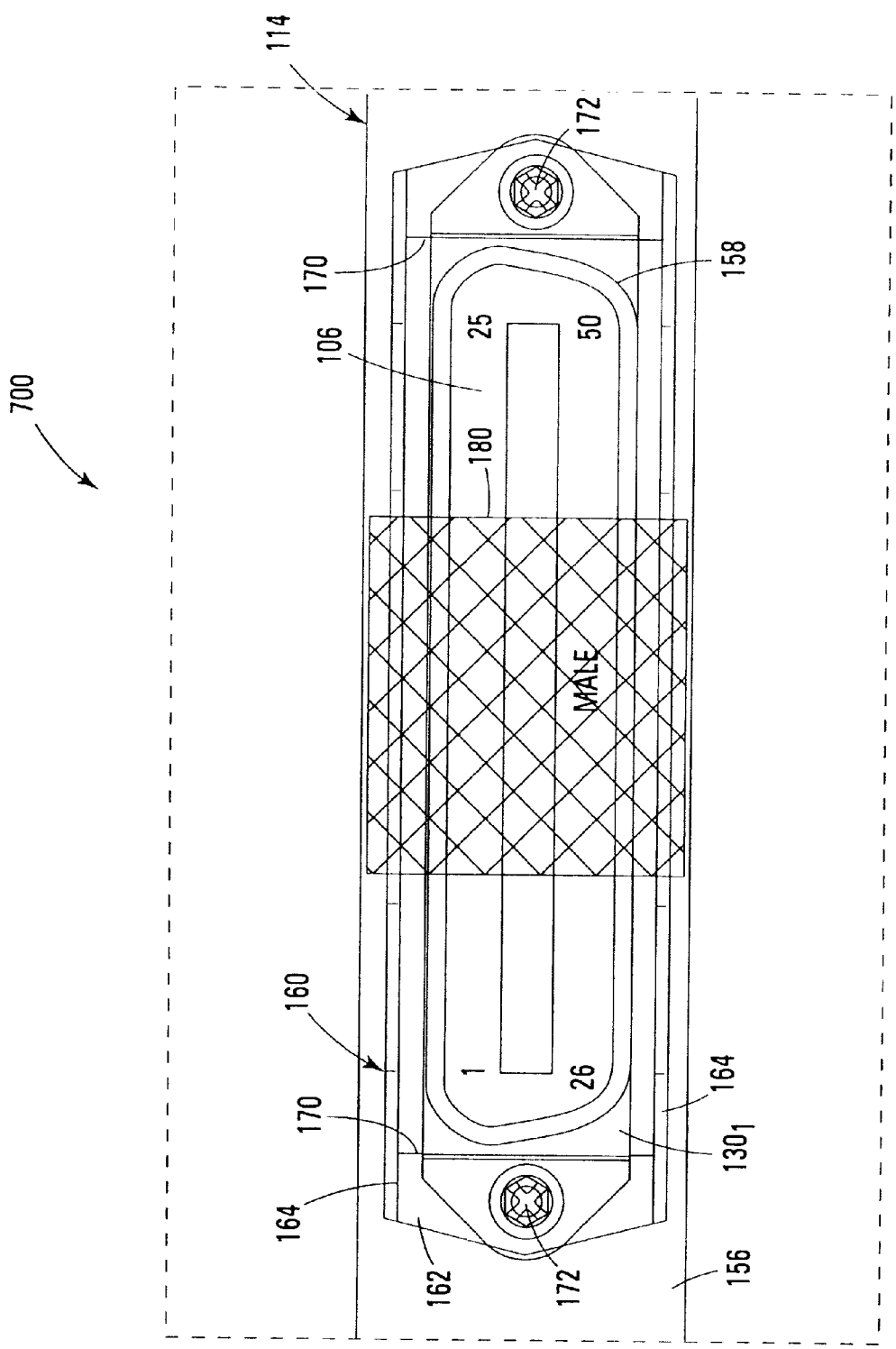
FIG. 7 is an enlarged view of region 700 of FIG. 2.

Mounting of connector 106 will be discussed with reference to FIGS. 4, 6, and 7. FIG. 7 is an enlarged view of region 700 of FIG. 2. FIG. 4 shows that front 114 of faceplate 101 has an interior surface 154 and an exterior surface 156. Interior surface 154 is also shown in FIG. 6, and exterior surface 156 is also shown in FIGS. 6 and 7. Connector 106 is mounted on interior surface 154 so that a portion 157 of connector 106 is located in channel 115 between sides 110 and 112, as shown in FIGS. 4 and 6, and portion 158 of connector 106 passes through aperture $130_1$ in front 114 and protrudes from exterior surface 156, as shown in FIGS. 6 and 7. Cable 108 includes a socket 159 that mates with posts of a terminal strip or header (not shown) mounted on circuit board 102 by soldering or the like. In this way, cable 108 electrically interconnects connector 106 and circuit board 102. In some embodiments, socket 159 is available from Samtec, Inc., New Albany, Ind. as part number IDSD-25-5-2.00-G.

In one embodiment, strap 180 is attached to a bracket 160 mounted on exterior surface 156 of faceplate 101, as shown in FIGS. 4, 6, and 7. In another embodiment, bracket 160 includes a base 162 and side-plates 164 protruding substantially perpendicularly from base 162 to form a channel 163 in bracket 160 that is substantially U-shaped, as shown in FIG. 4. In some embodiments, base 162 and side-plates 164 are integral. In one embodiment, strap 180 threads through each of slots 182 respectively in each of side-plates 164 of bracket 160 and wraps around mating connector 800. In another embodiment, matting connector 800 is straddled by side-plates 164 when mating connector is connected to connector 106.

In some embodiments, as shown in FIG. 4, an end 184 of strap 180 threads through one of slots 182, and a portion 186 of strap 180 adjacent end 184 attaches to strap 180, for example, at a location 188 of strap 180 using hook-and-loop material, a snap, or the like. Moreover, an end 190 of strap 180 threads through the other of slots 182, and a portion 192 of strap 180 adjacent end 190 attaches to strap 180, for example, at a location 194 of strap 180 using hook-and-loop material, a snap, or the like. In another embodiment a fastener 802, such as a screw or the like, passes through an eyelet 804 in mating connector 800 and threads into faceplate 101 to secure mating connector 800 and connector 106 together.

To mount connector 106 and bracket 160 on faceplate 101, connector 106 is butted against interior surface 154 and apertures 166 of connector 106 align with apertures 130$_2$ in faceplate 101, as shown in FIGS. 4 and 6, so that portion 158 passes through aperture 130$_1$, as shown in FIGS. 6 and 7. Base 162 of bracket 160 is butted against exterior surface 156 so that apertures 168 in base 162 align with apertures 130$_2$ in faceplate 101, as shown in FIGS. 4 and 6, an aperture 170 in base 162 aligns with aperture 130$_1$ in faceplate 101, as shown in FIG. 7, and portion 158 of connector 106 passes through aperture 170 and is straddled by side-plates 164, as shown in FIG. 7. Fasteners 172, such as hex-, Philips-Allen-, slot-head screws, or the like, are respectively passed through the apertures 168 in base 162 of bracket 160 and the apertures 130$_2$ in faceplate 112, and are threaded into apertures 166 in connector 106 to secure connector 106 and bracket 160 to faceplate 101, as shown in FIGS. 4 and 6.

CONCLUSION

Embodiments of the present invention have been described. The embodiments provide for adding ports to an electronic circuit card by mounting a connector on a faceplate of an electronic circuit card and connecting the connector to a circuit board of the electronic circuit card using a ribbon cable so that the connector does not extend beyond a side of the faceplate, as is the case when the connector is mounted on the circuit board. This enables the electronic circuit card to occupy substantially one slot of a housing, thereby enabling more cards to fit into the housing and easing removal and insertion of an adjacent circuit card compared to when the connector extends beyond the side of the faceplate and into an adjacent slot. This also enables contact between the faceplate and a faceplate of the adjacent electronic circuit card for shielding against electromagnetic interference leakage that is not otherwise provided when a cutout is made in the faceplate to accommodate the connector when the connector is mounted on the circuit board. Embodiments of the present invention provide a strap that is attached to the faceplate. The strap is adapted to secure a mating connector to the connector, thereby reducing the risk of the mating connector becoming disconnected from the connector, for example when a technician brushes against cabling attached to the mating connector.

Although specific embodiments have been illustrated and described in this specification, it will be appreciated by those of ordinary skill in the art that any arrangement that is calculated to achieve the same purpose may be substituted for the specific embodiment shown. This application is intended to cover any adaptations or variations of the present invention. For example, instead of threading strap 180 through each of slots 182 respectively in each of side-plates 164 of bracket 160 to secure connector 106 and mating connector 180 together, strap 180 can be threaded through a slot in each of a pair of plates that straddle connector 180 and are attached directly to faceplate 101 by welding or the like. Moreover, instead of using a single strap 180 to secure connector 106 and mating connector 180 together, each of two straps secured adjacent one end to faceplate 101, e.g., to each of sides 164 of bracket 160, to each of a pair of plates attached directly to faceplate 101, or the like, can be wrapped around mating connector 180 and joined together using a snap, hook-and-loop material, a buckle, or the like to secure connector 106 and mating connector 180 together. Bolting, screwing, or the like can also attach each of the pair straps directly to faceplate 101. For example, a screw can be passed through an eyelet (or grommet) in each of the two straps and threaded into faceplate 101. Electromagnetic interference gaskets 152 can be disposed on side 112 of faceplate 101 instead of side 110 or on both of sides 110 and 112. Alternatively, either of sides 110 or 112 or both of sides 110 and 112 can have an integral electromagnetic interference gasket. It is manifestly intended that this invention be limited only by the following claims and equivalents thereof.

What is claimed is:

1. An electronic circuit card comprising:
   a circuit board;
   a faceplate attached to the circuit board;
   a connector mounted on the faceplate such that the electronic circuit card occupies substantially one slot of a housing when the electronic circuit card is contained in the housing and wherein the connector is mounted on the faceplate to enable contact between the faceplate and a faceplate of an adjacent electronic circuit card for shielding against electromagnetic interference leakage when the electronic circuit card is contained in the housing;
   a ribbon cable electrically interconnecting the connector and the circuit board; and
   a strap attached to the faceplate, the strap adapted to secure a mating connector to the connector.

2. The electronic circuit card of claim 1, wherein the connector extends through an aperture in a front of the faceplate.

3. The electronic circuit card of claim 1, further comprising one or more electromagnetic interference gaskets disposed on at least one side of the faceplate.

4. The electronic circuit card of claim 3, wherein the one or more electromagnetic interference gaskets are adapted to contact the faceplate of the adjacent electronic circuit card for shielding against electromagnetic interference leakage.

5. The electronic circuit card of claim 1, wherein the connector is a 50-pin connector.

6. The electronic circuit card of claim 1, wherein the strap is attached to a bracket attached to a front of the faceplate.

7. The electronic circuit card of claim 1, wherein the faceplate comprises one or more latches adapted to latch the faceplate to the housing.

8. The electronic circuit card of claim 1, wherein the circuit board comprises two circuit boards.

9. The electronic circuit card of claim 1, wherein the strap comprises a pair of straps.

10. The electronic circuit card of claim 1, wherein the ribbon cable includes a socket that is adapted to mate with a terminal strip mounted on the circuit board.

11. The electronic circuit card of claim 1, wherein the circuit board comprises electronic components.

12. An electronic circuit card comprising:
a circuit board;
a faceplate attached to the circuit board, the faceplate having first and second sides and a front attached between the first and second sides;
a connector mounted on the front of the faceplate between the first and second sides such that the electronic circuit card occupies substantially one slot of a housing when the electronic circuit card is contained in the housing and wherein the connector is mounted on the faceplate to enable contact between the faceplate and a faceplate of an adjacent electronic circuit card for shielding against electromagnetic interference leakage when the electronic circuit card is contained in the housing, wherein a portion of the connector passes through an aperture in the front of the faceplate;
a ribbon cable electrically interconnecting the connector and the circuit board; and
a strap attached to the faceplate, the strap adapted to secure a mating connector to the connector.

13. The electronic circuit card of claim 12, further comprising one or more electromagnetic interference gaskets disposed on at least one of the first and second sides of the faceplate.

14. The electronic circuit card of claim 12, wherein the connector is a 50-pin connector.

15. The electronic circuit card of claim 12, wherein the strap is attached to a bracket attached to the front of the faceplate.

16. The electronic circuit card of claim 15, wherein an aperture in the bracket aligns with the aperture in the front of the faceplate and the portion of the connector passes through the aperture in the bracket.

17. The electronic circuit card of claim 12, wherein the faceplate comprises one or more latches adapted to latch the faceplate to a housing.

18. The electronic circuit card of claim 12, wherein the circuit board comprises two circuit boards.

19. The electronic circuit card of claim 12, wherein the ribbon cable includes a socket that is adapted to mate with a terminal strip mounted on the circuit board.

20. The electronic circuit card of claim 12, wherein the circuit board comprises electronic components.

21. An electronic circuit card comprising:
first and second circuit boards, wherein the first and second circuit boards are electrically interconnected and the second circuit board is mounted on the first circuit board;
a faceplate attached to the first circuit board, the faceplate having first and second sides and a front attached between the first and second sides;
a connector mounted on the front of the faceplate between the first and second sides such that the electronic circuit card occupies substantially one slot of a housing when the electronic circuit card is contained in the housing and wherein the connector is mounted on the faceplate to enable contact between the faceplate and a faceplate of an adjacent electronic circuit card for shielding against electromagnetic interference leakage when the electronic circuit card is contained in the housing, wherein a portion of the connector passes through an aperture in the front of the faceplate;
a ribbon cable electrically interconnecting the connector and the first circuit board; and
a strap attached to the faceplate, wherein the strap is wrappable about a mating connector for securing the mating connector to the connector.

22. The electronic circuit card of claim 21, wherein the connector is a 50-pin connector.

23. The electronic circuit card of claim 21, further comprising one or more electromagnetic interference gaskets disposed on at least one of the first or second sides of the faceplate.

24. The electronic circuit card of claim 21, wherein the strap comprises a pair of straps.

25. The electronic circuit card of claim 21, wherein the strap is attached to a bracket attached to the front of the faceplate.

26. The electronic circuit card of claim 21, wherein the faceplate comprises one or more latches adapted to latch the faceplate to a housing.

27. The electronic circuit card of claim 21, wherein the ribbon cable includes a socket that is adapted to mate with a terminal strip mounted on the circuit board.

28. The electronic circuit card of claim 21, wherein each of the first and second circuit boards comprises electronic components.

29. An electronic circuit card comprising:
a circuit board;
a faceplate attached to the circuit board, the faceplate having first and second sides and a front attached between the first and second sides;
one or more electromagnetic interference gaskets disposed on at least one of the first and second sides of the faceplate;
a 50-pin connector mounted on the front of the faceplate between the first and second sides such that the electronic circuit card occupies substantially one slot of a housing when the electronic circuit card is contained in the housing and wherein the 50-pin connector is mounted on the faceplate to enable contact between the one or more electromagnetic interference gaskets and a faceplate of an adjacent electronic circuit card for shielding against electromagnetic interference leakage when the electronic circuit card is contained in the housing, wherein a portion of the connector passes through an aperture in the front of the faceplate;
a ribbon cable electrically interconnecting the 50-pin connector and the circuit board;
a strap attached to the faceplate, the strap adapted to secure a mating connector to the 50-pin connector; and
one or more latches attached to the faceplate, the one or more latches adapted to latch the faceplate to the housing.

30. The electronic circuit card of claim 29, wherein the strap comprises a pair of straps.

31. The electronic circuit card of claim 29, wherein the strap is attached to a bracket attached to the front of the faceplate.

32. The electronic circuit card of claim 31, wherein an aperture in the bracket aligns with the aperture in the front of the faceplate and the portion of the connector passes through the aperture in the bracket.

33. The electronic circuit card of claim 29, wherein the ribbon cable includes a socket that is adapted to mate with a terminal strip mounted on the circuit board.

34. The electronic circuit card of claim 29, wherein the circuit board comprises electronic components.

35. An electronic circuit card comprising:
first and second circuit boards, wherein the first and second circuit boards are electrically interconnected and the second circuit board is mounted on the first circuit board;
a faceplate attached to the first circuit board, the faceplate having first and second sides and a front attached between the first and second sides;
one or more electromagnetic interference gaskets disposed on at least one of the first and second sides of the faceplate;
a 50-pin connector mounted on the front of the faceplate between the first and second sides such that the electronic circuit card occupies substantially one slot of a housing when the electronic circuit card is contained in the housing and wherein the 50-pin connector is mounted on the faceplate to enable contact between the one or more electromagnetic interference gaskets and a faceplate of an adjacent electronic circuit card for shielding against electromagnetic interference leakage when the electronic circuit card is contained in the housing, wherein a portion of the connector passes through an aperture in the front of the faceplate;
a ribbon cable electrically interconnecting the 50-pin connector and the first circuit board;
a strap attached to the faceplate, the strap adapted to secure a mating connector to the 50-pin connector; and
one or more latches attached to the faceplate, the one or more latches adapted to latch the faceplate to the housing.

36. The electronic circuit card of claim 35, wherein the strap comprises a pair of straps.

37. The electronic circuit card of claim 35, wherein the strap is attached to a bracket attached to the front of the faceplate.

38. The electronic circuit card of claim 37, wherein an aperture in the bracket aligns with the aperture in the front of the faceplate and the portion of the connector passes through the aperture in the bracket.

39. The electronic circuit card of claim 35, wherein the ribbon cable includes a socket that is adapted to mate with a terminal strip mounted on the circuit board.

40. The electronic circuit card of claim 35, wherein the circuit board comprises electronic components.

41. A method for manufacturing an electronic circuit card, the method comprising:
attaching a faceplate to a circuit board, the faceplate having first and second sides and a front attached between the first and second sides;
mounting a connector on the front of the faceplate between the first and second sides such that a portion of the connector extends through an aperture in the front of the faceplate, wherein mounting the connector on the front of the faceplate between the first and second sides enables the electronic circuit card to occupy substantially one slot of a housing when the electronic circuit card is contained in the housing and enables contact between the faceplate and a faceplate of an adjacent electronic circuit card for shielding against electromagnetic interference leakage when the electronic circuit card is contained in the housing;
electrically interconnecting the circuit board and the connector using a ribbon cable; and
attaching a strap to the faceplate, wherein the strap is wrappable about a mating connector for securing the mating connector to the connector.

42. The method of claim 41, wherein attaching the strap to the faceplate comprises attaching a pair of plates to the faceplate such that the pair of plates straddle the connector.

43. The method of claim 42, wherein attaching the strap to the faceplate further comprises threading the strap through a slot in each of the pair of plates.

44. The method of claim 41, wherein attaching the strap to the faceplate comprises attaching a bracket to the faceplate and attaching the strap to the bracket.

45. The method of claim 44, wherein attaching the bracket to the faceplate comprises aligning an aperture in the bracket with the aperture in the faceplate so that the portion of the connector extends through the aperture in the bracket and a pair of side plates of the bracket straddle the portion of the connector.

46. The method of claim 45, wherein attaching the strap to the bracket further comprises threading the strap through each of a pair of slots respectively in each of the pair of side plates.

47. The method of claim 41, further comprising attaching one or more latches to the faceplate, wherein the latches are adapted to latch the faceplate to the housing.

48. The method of claim 41, further comprising forming the aperture in the faceplate.

49. The method of claim 41, further comprising disposing one or more electromagnetic interference gaskets on at least one of the sides of the faceplate.

50. The method of claim 41, further comprising mounting another circuit board on the circuit board.

51. The method of claim 41, wherein electrically interconnecting the circuit board and the connector using the ribbon cable comprises connecting a socket of the ribbon cable to a terminal strip mounted on the circuit board.

52. The method of claim 41, wherein mounting the connector on the front of the faceplate comprises mounting a 50-pin connector on the front of the faceplate.

53. A method for manufacturing an electronic circuit card, the method comprising:
mounting a terminal strip on a first circuit board;
attaching a faceplate to the first circuit board, the faceplate having first and second sides and a front attached between the first and second sides, the faceplate also having one or more electromagnetic interference gaskets disposed on at least one of the first and second sides of the faceplate;
mounting a second circuit board on the first circuit board;
mounting a 50-pin connector on the front of the faceplate between the first and second sides such that a portion of the connector extends through an aperture in the front of the faceplate, wherein mounting the 50-pin connector on the front of the faceplate between the first and second sides enables the electronic circuit card to occupy substantially one slot of a housing when the electronic circuit card is contained in the housing and enables contact between the faceplate and a faceplate of an adjacent electronic circuit card for shielding against electromagnetic interference leakage when the electronic circuit card is contained in the housing;

electrically interconnecting the terminal strip and the 50-pin connector using a ribbon cable;

attaching a strap to the faceplate, wherein the strap is wrappable about a mating connector for securing the mating connector to the 50-pin connector; and attaching one or more latches to the faceplate, wherein the latches are adapted to latch the faceplate to the housing.

54. The method of claim 53, wherein attaching the strap to the faceplate comprises attaching a pair of plates to the faceplate such that the pair of plates straddle the 50-pin connector.

55. The method of claim 54, wherein attaching the strap to the faceplate comprises threading the strap through a slot in each of the pair of plates.

56. The method of claim 53, wherein attaching the strap to the faceplate comprises attaching a bracket to the faceplate and attaching the strap to the bracket.

57. The method of claim 56, wherein attaching the bracket to the faceplate comprises aligning an aperture in the bracket with the aperture in the faceplate so that the portion of the connector extends through the aperture in the bracket and a pair of side plates of the bracket straddle the portion of the connector.

58. The method of claim 57, wherein attaching the strap to the bracket further comprises threading the strap through each of a pair of slots respectively in each of the pair of side plates.

59. The method of claim 53, wherein electrically interconnecting the terminal strip and the 50-pin connector using the ribbon cable comprises connecting a socket of the ribbon cable to the terminal strip.

* * * * *